United States Patent
Sakurada et al.

(10) Patent No.: US 9,187,843 B2
(45) Date of Patent: Nov. 17, 2015

(54) METHOD AND APPARATUS FOR PRODUCING SEMICONDUCTOR CRYSTAL, AND SEMICONDUCTOR CRYSTAL

(75) Inventors: Takashi Sakurada, Itami (JP); Tomohiro Kawase, Itami (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 858 days.

(21) Appl. No.: 13/384,922

(22) PCT Filed: Jul. 23, 2010

(86) PCT No.: PCT/JP2010/062437
§ 371 (c)(1),
(2), (4) Date: Jan. 19, 2012

(87) PCT Pub. No.: WO2011/010724
PCT Pub. Date: Jan. 27, 2011

(65) Prior Publication Data
US 2012/0112135 A1    May 10, 2012

(30) Foreign Application Priority Data

Jul. 23, 2009 (JP) .................................. 2009-172196

(51) Int. Cl.
| C30B 15/00 | (2006.01) |
| C30B 15/02 | (2006.01) |
| C30B 15/20 | (2006.01) |
| C30B 15/14 | (2006.01) |
| C30B 11/06 | (2006.01) |
| C30B 29/40 | (2006.01) |
| C30B 29/42 | (2006.01) |
| C30B 29/44 | (2006.01) |

(52) U.S. Cl.
CPC ................. *C30B 15/02* (2013.01); *C30B 11/06* (2013.01); *C30B 15/00* (2013.01); *C30B 15/002* (2013.01); *C30B 15/14* (2013.01); *C30B 15/20* (2013.01); *C30B 29/40* (2013.01); *C30B 29/42* (2013.01); *C30B 29/44* (2013.01); *Y10T 117/1024* (2015.01)

(58) Field of Classification Search
CPC ...... C30B 15/00; C30B 15/002; C30B 15/02; C30B 15/10; C30B 15/14; C30B 15/20; C30B 15/30
USPC .......... 117/19, 20, 74, 224, 11, 13, 14, 30, 48
See application file for complete search history.

(56) References Cited

U.S. PATENT DOCUMENTS

| 6,866,714 B2 * | 3/2005 | Kawase et al. ................. 117/206 |
| 2007/0012238 A1 | 1/2007 | Kretzer et al. |

FOREIGN PATENT DOCUMENTS

| JP | 5-893 | 1/1993 |
| JP | 9-52788 | 2/1997 |
| JP | 10-218699 | 8/1998 |
| JP | 11-130578 | 5/1999 |
| JP | 2000-169277 | 6/2000 |
| JP | 2005-350295 | 12/2005 |
| JP | 2007-51054 | 3/2007 |

OTHER PUBLICATIONS

Machine translation of JP2005-350295.*

* cited by examiner

*Primary Examiner* — Khanh Tuan Nguyen
*Assistant Examiner* — Haidung Nguyen
(74) *Attorney, Agent, or Firm* — Drinker Biddle & Reath LLP

(57) ABSTRACT

A method of producing a semiconductor crystal is provided. The method includes the steps of preparing a longitudinal container with a seed crystal and an impurity-containing melt placed in a bottom section and with a suspension part arranged in an upper section and suspending a dropping raw material block made of a semiconductor material having an impurity concentration lower than the impurity concentration of the impurity-containing melt, and creating a temperature gradient in the longitudinal direction of the longitudinal container to melt the dropping raw material block, and solidifying the impurity-containing melt from the side that is in contact with the seed crystal (8) while dropping a produced melt into the impurity-containing melt, thereby producing a semiconductor crystal.

6 Claims, 7 Drawing Sheets

METHOD AND APPARATUS FOR PRODUCING SEMICONDUCTOR CRYSTAL, AND SEMICONDUCTOR CRYSTAL

TECHNICAL FIELD

The present invention relates to a method and an apparatus for producing a semiconductor crystal, and the semiconductor crystal. Particularly, the present invention relates to a method and an apparatus for producing a semiconductor crystal excellent in uniformity of impurity concentration, and the semiconductor crystal.

BACKGROUND ART

Conventionally, semiconductor crystals are suitably used as a substrate for an optical device such as a light emitting diode (LED) and a laser diode (LD), or a substrate for an electronic device such as a transistor.

It is known that device properties of such an optical device and an electronic device are greatly affected by the impurity concentration, carrier concentration and the like of a substrate. Therefore, to solve variations in device properties among optical devices and electronic devices, it is necessary, for example, to make the impurity concentration distribution in a used semiconductor crystal more uniform.

FIG. 6 shows a schematic cross sectional view of an example of a conventional apparatus for producing a semiconductor crystal. This production apparatus 200 includes a crucible 20, a heat-resistant container 21 that encloses crucible 20, heaters 22a to 22d provided outside heat-resistant container 21, a $B_2O_3$ seal 23 for sealing heat-resistant container 21, and a chamber 24 that stores these members.

According to a method of producing a semiconductor crystal using this production apparatus 200, first, a GaAs seed crystal 25 is disposed at the bottom of crucible 20, and a raw material made of a GaAs polycrystal containing Si as an impurity and a sealant 26 made of $B_2O_3$ are placed sequentially on this GaAs seed crystal 25. Then, heater 22d heats $B_2O_3$ seal 23. $B_2O_3$ is thereby melted to seal heat-resistant container 21. Then, heaters 22a to 22c heat crucible 20, so that the GaAs polycrystal in crucible 20 is once melted.

Thereafter, the temperature of a GaAs melt 27 derived from the GaAs polycrystal is gradually decreased upward from the bottom of crucible 20. Along with this temperature change, GaAs melt 27 solidifies from its lower side that is in contact with seed crystal 25 located at the bottom of crucible 20 toward its upper side, so that a Si-containing GaAs crystal 28 is produced. GaAs crystal 28 extracted from crucible 20 is cut out in a direction orthogonal to its growth direction for use as a substrate for an optical device or a substrate for an electronic device.

However, Si in GaAs melt 27 has a segregation coefficient less than or equal to 1 relative to GaAs crystal 28, and is thus incorporated into GaAs crystal 28 only in a concentration lower than the Si concentration in GaAs melt 27 due to a segregation phenomenon. Therefore, the Si decrease amount in GaAs melt 27 is less than the amount of decrease of GaAs melt 27, so that the Si concentration in GaAs melt 27 increases as GaAs crystal 28 grows. Accordingly, the Si concentration in GaAs crystal 28 increases gradually from its lower side to its upper side, which causes variations in impurity concentration among a plurality of substrates cut out from a single GaAs crystal 28.

On the other hand, Japanese Patent Laying-Open No. 2005-350295 (Patent Literature 1) discloses an apparatus in which a raw material as a semiconductor polycrystal is placed in a container arranged above a crucible, as shown in FIG. 7. In a crystal production apparatus 300 of FIG. 7, heaters 31a to 31e each generate heat, thereby creating a temperature gradient in the vertical direction in the crystal production apparatus. In this crystal production apparatus 300, a crucible 32 is heated with heaters 31a to 31c, so that a GaAs polycrystal in crucible 32 is melted. Then, the temperature of a GaAs melt 33 containing Si derived from the GaAs polycrystal decreases gradually from the lower side toward the upper side of crucible 32, so that Si-containing GaAs melt 33 placed in crucible 32 solidifies from the side (lower side) that is in contact with a seed crystal 34 to the upper side. On the other hand, simultaneously with the solidification of GaAs melt 33, a raw material 36 placed in a container 35 is melted from the lower side toward the upper side of container 35. Since a melt 37 derived from raw material 36 is dropped into Si-containing GaAs melt 33 located under a sealant 40, changes in Si concentration in the melt in the crucible along with crystal growth can be compensated for, as a result of which a GaAs crystal 38 having a uniform carrier concentration can be produced.

Japanese Patent Laying-Open No. 9-52788 (Patent Literature 2) discloses an apparatus in which a raw material is charged into a tapered-shape container arranged above a crucible. Also in this apparatus, a semiconductor polycrystal is melted from the lower side toward the upper side of the container simultaneously with crystal growth from the lower side toward the upper side of the crucible. Therefore, similarly to the apparatus disclosed in Patent Literature 1, changes in Si concentration in the melt in the crucible along with crystal growth can be compensated for by dropping of a melt of the raw material in the crucible.

CITATION LIST

Patent Literature

PTL 1: Japanese Patent Laying-Open No. 2005-350295
PTL 2: Japanese Patent Laying-Open No. 9-52788

SUMMARY OF INVENTION

Technical Problem

However, in the apparatus disclosed in Patent Literature 1, when part of the raw material at the lower side of the container is melted, part of the raw material at the upper side in the container may sink downward. In this apparatus, a weighing machine 39 controls the dropping speed by monitoring the weight of the container, however, the dropping speed of the melt will vary complicatedly due to changes in location of the raw material in the vertical direction in the container. This will complicate temperature control of the raw material, which, as a result, may degrade the reproducibility in production of a semiconductor crystal having a uniform impurity concentration.

In the apparatus disclosed in Patent Literature 2, the container and the raw material block need to be exactly identical in shape so as to maintain the raw material at a predetermined position. When the container and the raw material block are not exactly identical in shape, for example, when the taper angle of the raw material is smaller than the taper angle of the container, the raw material block will be displaced downward from the predetermined position in the container. If the raw material is displaced from the predetermined position, the dropping speed of the melt will vary complicatedly from a desired speed, as a result of which the impurity concentration of a semiconductor crystal produced will not be uniform.

Patent Literature 2 describes that the raw material can be prevented from displacing from a predetermined position by setting the temperature gradient that can be set for the raw material at a steep gradient of 30° C./cm, for example. To achieve such a steep temperature gradient, it is necessary to cool the upper side of the raw material. However, since heat applied by the heaters is carried upward in a furnace body by gas convection, it is difficult to create such a temperature gradient with high controllability.

In Patent Literature 2, the weight of the raw material that can be held in the container is restricted since the raw material is held at the predetermined position by friction with the container, and further, there may be chipping of the container due to wear, contamination due to falling of chips, and the like. Therefore, the apparatus disclosed in Patent Literature 2 has a problem in that a large-diameter and long semiconductor crystal cannot be produced, for example. Further, part of the container worn by friction with the raw material may fall down in the crucible.

In light of the above-described problems, an object of the present invention is to provide a method and an apparatus for producing a semiconductor crystal excellent in uniformity of impurity concentration, and the semiconductor crystal.

Solution to Problem

The present invention is directed to a method of producing a semiconductor crystal by placing a seed crystal and a melt containing an impurity in a longitudinal container and solidifying the impurity-containing melt from a lower side that is in contact with the seed crystal to an upper side, wherein the semiconductor crystal is produced by solidifying the impurity-containing melt from the lower side that is in contact with the seed crystal to the upper side while dropping, into the seed crystal and the impurity-containing melt placed in a bottom section of the longitudinal container, a melt of a dropping raw material block suspended above the bottom section and made of a semiconductor material having an impurity concentration lower than an impurity concentration of the impurity-containing melt.

Preferably, in the above-described production method, the longitudinal container has the bottom section for placing therein the seed crystal and the impurity-containing melt, and an upper section located above the bottom section in a longitudinal direction, the production method including the steps of preparing the longitudinal container with the seed crystal and the impurity-containing melt placed in the bottom section and with a suspension part suspending the dropping raw material block arranged in the upper section, and moving the longitudinal container relatively with respect to a temperature gradient provided in the longitudinal direction of the longitudinal container, and in the relatively moving step, the impurity-containing melt is solidified from a side that is in contact with the seed crystal while a melt of the dropping raw material block is dropped.

Preferably, in the above-described production method, the preparing step includes the steps of placing a raw material made of a semiconductor material and the impurity on the seed crystal placed in the bottom section, suspending the dropping raw material block on the suspension part arranged in the upper section, and melting the raw material made of the semiconductor material and the impurity to dispose the impurity-containing melt on the seed crystal.

Preferably, in the above-described production method, at least part of the suspension part and at least part of the dropping raw material block are fitted with each other, so that the dropping raw material block is suspended toward the impurity-containing melt.

Preferably, in the above-described production method, $((1-k)-0.25) \leq S1/S2 \leq ((1-k)+0.25)$ is satisfied where $S1$ represents a horizontal cross sectional area of the dropping raw material block, $S2$ represents a horizontal cross sectional area of the semiconductor crystal, and $k$ represents a segregation coefficient of the impurity contained in the impurity-containing melt.

Preferably, in the above-described production method, the seed crystal, the impurity-containing melt and the dropping raw material block are made of at least one semiconductor material of the group consisting of GaAs, InP, InAs, and GaP, and the impurity is at least one of the group consisting of In, Zn, Si, Al, S, Sn, Se, Te, Cr, C, O, Fe, and Ga.

Preferably, in the above-described production method, the seed crystal, the impurity-containing melt and the dropping raw material block are made of at least one semiconductor material of the group consisting of Ge, Si and GeSi, and the impurity is at least one of the group consisting of As, Ga, In, P, B, and Sb.

Preferably, in the above-described production method, the suspension part is made of at least one of the group consisting of BN, pBN, $Al_2O_3$, AlN, SiC, quartz, Mo, W, Ta, and stainless steel.

The present invention is also directed to a production apparatus for a semiconductor crystal by placing a seed crystal and a melt containing an impurity in a longitudinal container and solidifying the impurity-containing melt from a lower side that is in contact with the seed crystal to an upper side. The production apparatus includes the longitudinal container having a bottom section for placing therein the seed crystal and the impurity-containing melt, and an upper section located above the bottom section in a longitudinal direction, a suspension part arranged in the upper section of the longitudinal container for suspending the dropping raw material block, made of a semiconductor material having an impurity concentration lower than an impurity concentration of the impurity-containing melt, toward the impurity-containing melt, and a temperature control unit for providing a temperature gradient in the longitudinal direction of the longitudinal container.

Preferably, in the above-described production apparatus, the suspension part is made of at least one of the group consisting of BN, pBN, $Al_2O_3$, AlN, SiC, quartz, Mo, W, Ta, and stainless steel.

The present invention is also directed to a semiconductor crystal, wherein a rate of change in carrier concentration or impurity concentration is less than or equal to 0.5 at a solidified fraction of 0.1 to 0.8.

Preferably, in the above-described semiconductor crystal, the semiconductor crystal is made of at least one semiconductor material of the group consisting of GaAs, InP, InAs, and GaP, and the impurity is at least one of the group consisting of In, Zn, Si, Al, S, Sn, Se, Te, Cr, C, O, Fe, and Ga.

Preferably, in the above-described semiconductor crystal, the semiconductor crystal is made of at least one semiconductor material of the group consisting of Ge, Si and GeSi, and the impurity is at least one of the group consisting of As, Ga, In, P, B, and Sb.

Advantageous Effects of Invention

According to the present invention, a method and an apparatus for producing a semiconductor crystal excellent in uniformity of carrier concentration and impurity concentration, and the semiconductor crystal can be provided.

DESCRIPTION OF EMBODIMENTS

Figure 1:
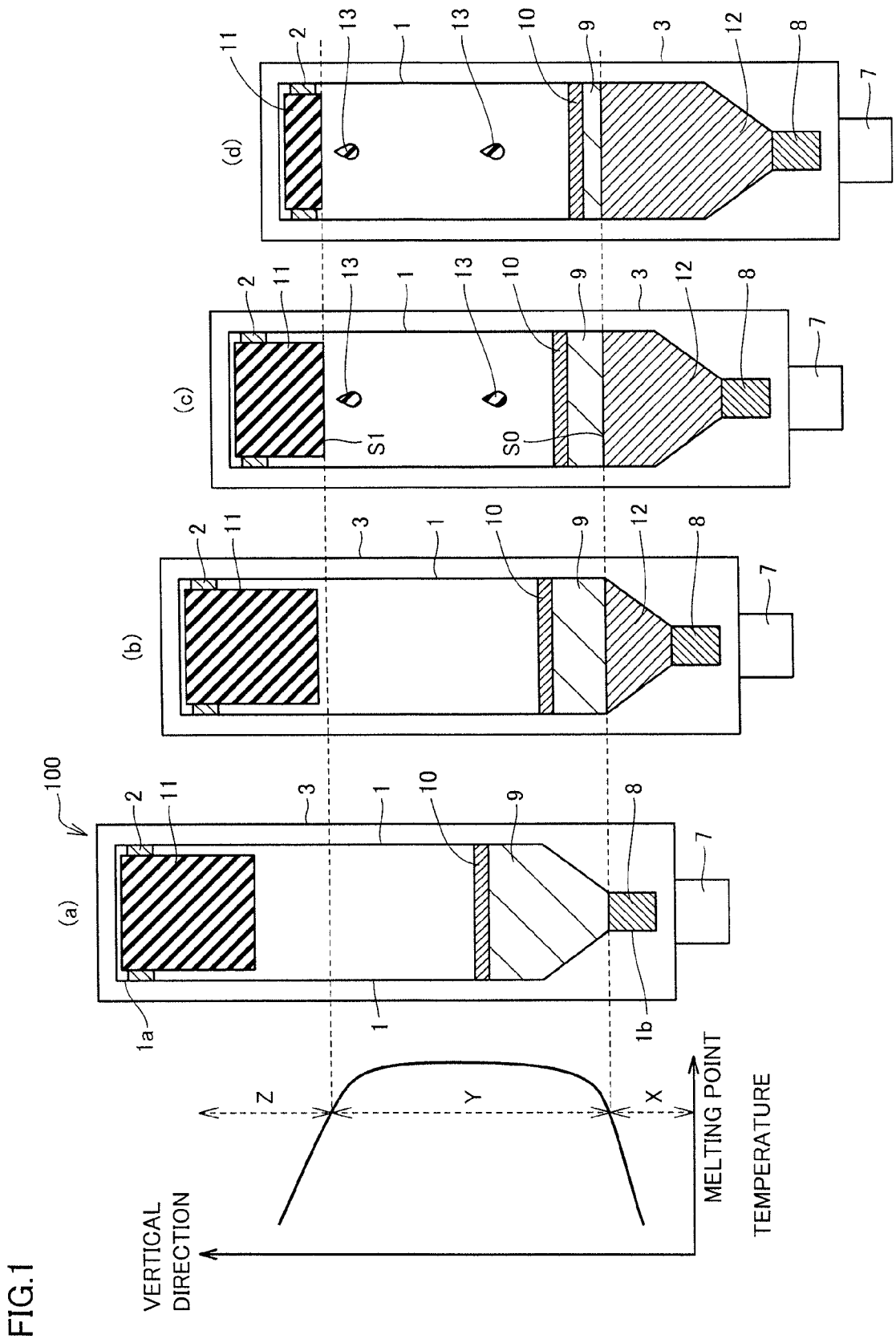
FIG. 1 is a diagram for describing a production method according to the present invention.

Hereinbelow, embodiments of the present invention will be described. It is noted that, in the drawings of the present application, the same reference characters shall represent the same parts or corresponding parts. In addition, a solidified fraction relatively represents the position of a crystalline portion in the growth direction of a semiconductor crystal. Therefore, in the present specification, the solidified fraction is an index indicating a growth start point of a semiconductor crystal by 0, increasing as the semiconductor crystal grows, and indicating a growth termination point by 1. A segregation coefficient (k) is a value (k=C1/C2) obtained by dividing an impurity concentration (C1) in a growing semiconductor crystal by an impurity concentration (C2) in a melt.

First Embodiment

Method of Producing Semiconductor Crystal

FIG. 1 is a diagram for describing a method of producing a semiconductor crystal according to the present invention.

In FIG. 1, a crystal production apparatus 100 used in the production method according to the present embodiment includes a longitudinal container 1 having a bottom section 1*b* and an upper section 1*a* located above bottom section 1*b* in the longitudinal direction. Longitudinal container 1 may be composed of a single part. That is, bottom section 1*b* and upper section 1*a* may be composed of the same part. Alternatively, longitudinal container 1 may be composed of a plurality of parts. For example, a part constituting bottom section 1*b* and a part constituting upper section 1*a* may be formed integrally.

Crystal production apparatus 100 further includes a suspension part 2 provided in upper section 1*a* of longitudinal container 1, a heat-resistant container 3 that encloses longitudinal container 1 and suspension part 2, and a lower shaft 7 for moving heat-resistant container 3 in the vertical direction.

In addition, heaters (not shown) as a temperature control unit that can set a temperature gradient in the longitudinal direction in heat-resistant container 3 (hereinafter also referred to as a "vertical direction") are arranged around heat-resistant container 3. That is, longitudinal container 1 can be moved in the vertical direction relatively with respect to the temperature gradient because of the movement of lower shaft 7 in the vertical direction.

In the present embodiment, a melt of a dropping raw material block (hereinafter referred to as a "raw material block") suspended above bottom section 1*b* is dropped into a seed crystal and an impurity-containing melt placed in bottom section 1*b* of longitudinal container 1. At this time, the impurity concentration of a semiconductor material used as the raw material block is lower than the impurity concentration of the impurity-containing melt. Then, the melt is dropped while the impurity-containing melt is solidified from its lower side that is in contact with the seed crystal toward its upper side. A semiconductor crystal having a uniform impurity concentration can thus be produced.

The above-described production method can be accomplished by, for example, preparing longitudinal container 1 with a seed crystal 8 and an impurity-containing melt 9 placed in bottom section 1*b* and with suspension part 2 suspending a raw material block 11 arranged in upper section 1*a* (see FIG. 1 (*a*)), and then moving longitudinal container 1 relatively with respect to the temperature gradient provided in the longitudinal direction of longitudinal container 1 (see the graph of FIG. 1). Alternatively, the method can be accomplished by controlling the temperature of the heaters to shift the temperature gradient provided in the longitudinal direction of longitudinal container 1, without moving longitudinal container 1.

Referring to FIG. 1, the case of producing a semiconductor crystal by the method of moving the longitudinal container relatively with respect to the temperature gradient provided in the longitudinal direction of longitudinal container 1 will now be described in detail. It is noted that, in the present embodiment, a GaAs crystal containing Si as an impurity (dopant) is produced as a semiconductor crystal.

<<Step of Preparing Longitudinal Container>>

First, as shown in FIG. 1(*a*), longitudinal container 1 with seed crystal 8 and impurity-containing melt 9 placed in bottom section 1*b* and with suspension part 2 suspending raw material block 11 arranged in upper section 1*a* is prepared. This step can be performed as follows, for example.

1. Step of Placing Raw Material on Seed Crystal

First, seed crystal 8 is placed in bottom section 1*b* of longitudinal container 1, and further, a raw material composed of a semiconductor material and an impurity (dopant) is placed on this seed crystal 8.

Specifically, seed crystal 8 made of GaAs is placed in bottom section 1*b* of longitudinal container 1, and a raw material (hereinafter also referred to as a "solid raw material") made of GaAs as a semiconductor material and Si as an impurity is disposed on this seed crystal 8. It is noted that GaAs and Si may be single crystal or polycrystal. Further, a sealant 10 made of $B_2O_3$ may be placed on the solid raw material.

Of the solid raw material, the semiconductor material may be a compound semiconductor such as InP, InAs or GaP instead of GaAs, and in this case, of the solid raw material, the impurity is preferably at least one of the group consisting of In, Zn, Si, Al, S, Sn, Se, Te, Cr, C, O, Fe, and Ga.

Alternatively, the semiconductor material constituting the solid raw material may be a semiconductor material such as Ge, Si and GeSi, and in this case, the impurity constituting the solid raw material is preferably at least one of the group consisting of As, Ga, In, P, B, and Sb.

Here, GaAs and Si constituting the solid raw material are melted in a step that will be described later to turn into impurity-containing melt 9. Therefore, the mass of GaAs and the mass of Si in the solid raw material are equivalent to the mass of a GaAs melt and the mass of Si in impurity-containing melt 9. The impurity concentration is usually in the range of $1 \times 10^{15}$ to $3 \times 10^{19}$ cm$^{-3}$.

As to the impurity concentration of a semiconductor crystal produced, the impurity concentration that generates carriers in the semiconductor crystal (such as Zn, Si, S, Sn, Se, or Te in a GaAs crystal or an InP crystal, or the like) can be estimated by a Hall measurement or the like, but can also be analyzed directly by SIMS analysis or the like. Moreover, the impurity concentration that generates no carriers or few carriers in the semiconductor crystal (such as In, Al, Cr, C, O in a GaAs crystal, or Al, Fe or Ga in an InP crystal, or the like) can be measured by SIMS analysis, ICP analysis, GDMS analysis, FTIR analysis, or the like. The impurity concentration of a semiconductor crystal such as GaP, InAs, Ge, Si, GeSi, or the like can also be measured similarly by SIMS analysis, ICP analysis, GDMS analysis, or the like.

2. Step of Suspending Raw Material Block

Then, raw material block 11 having an impurity concentration lower than the impurity concentration of impurity-containing melt 9 is suspended on suspension part 2.

Specifically, raw material block 11 having a Si concentration lower than the Si concentration of impurity-containing melt 9, namely, GaAs melt 9 containing Si as an impurity (hereinafter referred to as a "Si—GaAs melt") is suspended on suspension part 2 arranged in upper section 1a of longitudinal container 1. Raw material block 11 may be either polycrystal or single crystal, and may be a single raw material block or may be composed of a plurality of raw material blocks. When raw material block 11 contains an impurity and the impurity has a segregation coefficient less than 1, raw material block 11 may contain an impurity having a concentration lower than the impurity concentration of the Si—GaAs melt in longitudinal container 1. It is noted that, when the impurity has a segregation coefficient more than or equal to 1, raw material block 11 needs to contain an impurity having a concentration higher than the impurity concentration of Si—GaAs melt 9 in longitudinal container 1.

In this step, at least part of suspension part 2 arranged in upper section 1a of longitudinal container 1 and at least part of raw material block 11 as a dropping raw material are fitted with each other, so that raw material block 11 is suspended toward Si—GaAs melt 9 in longitudinal container 1.

Suspension part 2 should only suspend raw material block 11 at a position substantially perpendicularly above Si—GaAs melt 9 in longitudinal container 1 where raw material block 11 is not in contact with Si—GaAs melt 9, and the position of upper section 1a shown in FIG. 1(a) is not a limitation. Suspension part 2 may be integrated with longitudinal container 1, for example, or may be fixed to heat-resistant container 3. Suspension part 2 is preferably composed of at least one of the group consisting of BN (boron nitride), pBN (pyrolytic BN), Al$_2$O$_3$ (alumina), AlN (aluminium nitride), SiC (silicon carbide), quartz, Mo (molybdenum), W (tungsten), Ta (tantalum), and stainless steel. They have high heat resistance and high strength even at high temperatures, and can therefore prevent chipping of suspension part 2, contamination due to falling of chips, and the like.

Heat-resistant container 3 is preferably made of airtight carbon, BN, pBN, Al$_2$O$_3$, AlN, SiC, quartz, Mo, W, Ta, stainless steel, or composite materials thereof from the viewpoint of heat resistance.

3. Step of Disposing Impurity-containing Melt on Seed Crystal

Next, GaAs and Si are melted by heating bottom section 1b of longitudinal container 1 with a heater or the like to or higher than the melting point temperature of GaAs to generate Si—GaAs melt 9. It is noted that, at this time, it is preferable to provide a temperature gradient in the vertical direction of longitudinal container 1 so as not to melt seed crystal 8.

By performing the above steps 1 to 3, longitudinal container 1 with seed crystal 8 and Si—GaAs melt 9 placed in bottom section 1b and with suspension part 2 suspending raw material block 11 arranged in upper section 1a is prepared, as shown in FIG. 1(a). Alternatively, longitudinal container 1 in this state can also be prepared by the following method.

Specifically, first, seed crystal 8 made of GaAs is placed in bottom section 1b of longitudinal container 1, and GaAs and Si as a solid raw material are disposed on this seed crystal 8. Then, GaAs and Si are melted by heating with a heater, thereby disposing Si—GaAs melt 9 on seed crystal 8. It is noted that sealant 10 made of B$_2$O$_3$ may be placed on Si—GaAs melt 9. Then, raw material block 11 is suspended in a similar manner to that described above. Longitudinal container 1 in the state shown in FIG. 1(a) can also be prepared by this method.

<<Step of Relatively Moving Longitudinal Container with Respect to Temperature Gradient>>

After preparing longitudinal container 1 with seed crystal 8, Si—GaAs melt 9 and raw material block 11 disposed therein by the above-described steps, longitudinal container 1 is moved relatively with respect to the temperature gradient. That is, as shown in the graph in FIG. 1 and at (a), heat-resistant container 3 is moved in the vertical direction relatively with respect to the temperature gradient set in the vertical direction by heaters not shown. Raw material block 11 is thereby melted, and Si—GaAs melt 9 is solidified while the resultant melt is dropped into Si—GaAs melt 9, so that a GaAs semiconductor crystal is produced. It is noted that, in FIG. 1, the graph at the left side in the drawing shows the temperature gradient provided in the longitudinal direction of longitudinal container 1, and (a) to (d) each show a relative position with respect to the temperature gradient shown in the graph as well as the states of Si—GaAs melt 9, raw material block 11 and a semiconductor crystal 12 in the case of that position.

Specifically, first, the temperature gradient shown in the graph of FIG. 1 is created in the vertical direction in heat-resistant container 3 by temperature control with the heaters. At this time, heat-resistant container 3 that stores longitudinal container 1 is at the position shown in FIG. 1(a) with respect to the temperature gradient shown in the graph of FIG. 1. Although the graph of FIG. 1 shows the temperature gradient of generated heat temperature in the vertical direction of the heaters, it substantially indicates the temperature of longitudinal container 1 and each member in it in heat-resistant container 3 located at the same position as each heater in the vertical direction. This means that the graph of FIG. 1 indicates the temperature gradient created in heat-resistant container 3. It is noted that the "melting point" on the horizontal axis of the graph indicates the "melting point of GaAs."

That is, in FIG. 1(a), seed crystal 8 in longitudinal container 1 is located in an X region of the temperature gradient in which the temperature rises in the upper direction, Si—GaAs melt 9 is located in a Y region of the temperature gradient maintained at a temperature more than or equal to the melting point, and raw material block 11 is located in a Z region of the temperature gradient in which the temperature drops in the upper direction.

Then, support shaft 7 supporting heat-resistant container 3 is moved downward, so that heat-resistant container 3 is moved downward relatively with respect to the temperature gradient. With this movement, Si—GaAs melt 9 in longitudinal container 1 is moved gradually from its lower side that is in contact with seed crystal 8 to a temperature region less than the melting point.

Here, the moving speed of support shaft 7 is set at such a speed that GaAs located in the temperature region more than or equal to the melting point can be completely melted and GaAs located in the temperature region less than the melting point can be completely solidified. Therefore, when heat-resistant container 3 has been moved to the position shown in FIG. 1(b) with respect to the temperature gradient along with the movement of support shaft 7, that is, when the upper end of the Y region has reached the vicinity of the lower end of raw material block 11 and the lower end of the Y region has reached the upper end of the tapered-shape section of longitudinal container 1, GaAs crystal 12 grown up upward will exist in a section of longitudinal container 1 located in the X region of the temperature gradient, and Si—GaAs melt 9 will exist in a section of longitudinal container 1 located in the Y region of the temperature gradient. Raw material block 11 has been moved within the Z region of the temperature gradient, and remains solid because the Z region has a temperature less than the melting point. It is noted that, in the state shown in FIG. 1(b), the solidified fraction is usually less than or equal to 0.1.

Then, support shaft 7 is further moved downward at a predetermined speed, so that raw material block 11 is moved gradually from its lower side to the temperature region more than or equal to the melting point. Raw material block 11 is thereby melted gradually from its lower end, and a resultant GaAs melt 13 drops downward toward Si—GaAs melt 9. Simultaneously, Si—GaAs melt 9 is moved gradually from the lower side to the temperature region less than the melting point, so that GaAs crystal 12 continues growing upward.

Therefore, after the movement to the position shown in FIG. 1(c), for example, along with the relative downward movement of heat-resistant container 3 with respect to the heaters, grown-up GaAs crystal 12 will exist in the section of longitudinal container 1 located in the X region, Si—GaAs melt 9 will exist in the section of longitudinal container 1 located in the Y region, and raw material block 11 will exist in the section of longitudinal container 1 located in the Z region.

Further, the crystal growth progresses by heat-resistant container 3 continuing moving downward relatively with respect to the temperature gradient, so that most of Si—GaAs melt 9 in longitudinal container 1 grows up into GaAs crystal 12 as shown in FIG. 1(d). Finally, the crystal growth of the whole Si—GaAs melt 9 is accomplished, and the solidified fraction of GaAs crystal 12 reaches 1, so that this production method is terminated.

According to the above-described production method of a semiconductor crystal, GaAs crystal 12 grows up while GaAs melt 13 derived from raw material block 11 is dropped into Si—GaAs melt 9 under environments of the previously set temperature gradient. Therefore, changes in impurity concentration in Si—GaAs melt 9 due to the dropping of GaAs melt 13 from raw material block 11 can be compensated for by setting appropriately the relationship among the respective parameters of a melting speed $v1$ of raw material block 11 (dropping speed of GaAs melt 13), a growing speed $v2$ of GaAs crystal 12, a segregation coefficient k of impurity, an impurity concentration $C1$ in GaAs melt 13, and an impurity concentration $C2$ in Si—GaAs melt 9. By thus compensating for changes in impurity concentration in Si—GaAs melt 9, as a result, a semiconductor crystal excellent in uniformity of impurity concentration and carrier concentration can be produced.

On the other hand, if raw material block 11 as a dropping raw material displaces in the vertical direction in the course of growth of GaAs crystal 12, the need will arise to adjust the previously set temperature gradient to conform to the displacement. However, according to the present embodiment, raw material block 11 is held at a predetermined position by being fit into suspension part 2, and will thus not be displaced in the vertical direction. Thus, there will be no complicated changes in dropping speed of GaAs melt 13 that would result from a displacement of the dropping raw material. Therefore, the above-mentioned parameters are easy to set, as a result of which a semiconductor crystal excellent in uniformity of impurity concentration can be produced with high reproducibility.

Further, since raw material block 11 is suspended and differs from the structure in which the raw material is held by friction as in Patent Literature 2, the allowable range of weight of raw material is wider than in Patent Literature 2. Therefore, according to the present invention, a large-diameter and long semiconductor crystal can be produced. In addition, raw material block 11 and suspension part 2 have a small contact area or no contact area, wear and chipping of suspension part 2, contamination by falling of chips, and the like can be prevented.

Since heat-resistant container 3 is moved in the vertical direction in the present embodiment, longitudinal container 1 and suspension part 2 can be moved integrally in the vertical direction in the apparatus. In this case, the distance from suspension part 2 to longitudinal container 1 can easily be kept constant, so that the dropping amount of GaAs melt 13 can be controlled with higher precision.

Longitudinal container 1 may be relatively moved without moving heat-resistant container 3. It is noted that, when longitudinal container 1 and suspension part 2 are not moved integrally, it is necessary to set a temperature gradient in consideration of changes in distance between longitudinal container 1 and suspension part 2. Further, instead of moving heat-resistant container 3, longitudinal container 1 and suspension part 2 in the vertical direction, the heaters may be moved such that the temperature gradient shown in FIG. 1 is shifted upward with respect to heat-resistant container 3. The temperature gradient provided in the longitudinal direction of longitudinal container 1 may be shifted by controlling the temperature of the heaters without moving longitudinal container 1.

Figure 2A:
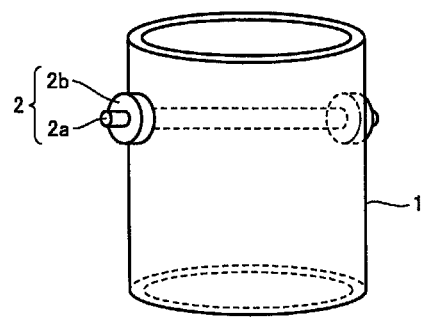
FIG. 2A is a diagram showing an example of shape of a suspension part.
Figure 2B:
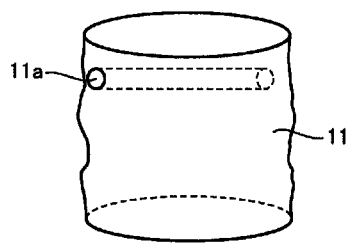
FIG. 2B is a diagram showing the shape of a raw material block suitable for the suspension part shown in FIG. 2A.
Figure 3A:
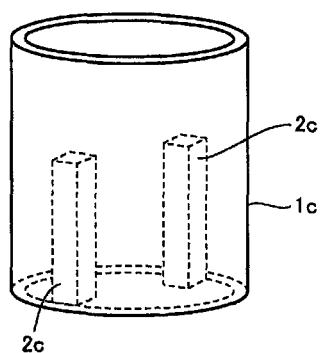
FIG. 3A is a diagram showing another example of shape of the suspension part.
Figure 3B:
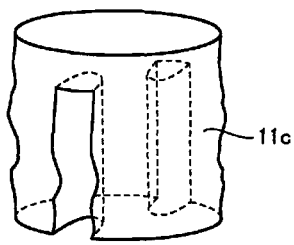
FIG. 3B is a diagram showing the shape of a raw material block suitable for the suspension part shown in FIG. 3A.

Suspension part 2 and raw material block 11 may have structures as shown in FIGS. 2A and 2B, as well as FIGS. 3A and 3B. FIG. 2A is a diagram showing an example of shape of the suspension part, and FIG. 2B is a diagram showing the shape of a raw material block suitable for the suspension part shown in FIG. 2A. FIG. 3A is a diagram showing another example of shape of the suspension part, and FIG. 3B is a diagram showing the shape of a raw material block suitable for the suspension part shown in FIG. 3A. It is noted that, for ease of description, each drawing shows longitudinal container 1 cut horizontally at the upper side and the lower side of upper section 1a.

In FIG. 2A, suspension part 2 is composed of a rod-like member 2a and a ring-like member 2b. In FIG. 2B, raw material block 11 has formed therein a through hole 11a through which rod-like member 2a of suspension part 2 can be inserted. Rod-like member 2a is inserted through a hole formed in a side surface of longitudinal container 1 and through hole 11a of raw material block 11 placed in the inner space of longitudinal container 1, and ring-like members 2b are fitted over the both ends of inserted rod-like member 2a. With this structure, raw material block 11 can be suspended toward bottom section 1b.

In FIG. 3A, a suspension part 2c provided in the inner wall of longitudinal container 1 has a rod-like shape, and is arranged substantially in parallel to the vertical direction in the inner wall of longitudinal container 1. When this suspension part 2c is used, raw material block 11c as shown in FIG. 3B with slots formed at a position corresponding to suspension part 2c is used as the raw material block. In this case, suspension part 2c is fitted into the slots of raw material block 11c, so that raw material block 11c can be suspended downward in longitudinal container 1.

Second Embodiment

Method of Producing Semiconductor Crystal

The second embodiment is such that $((1-k)-0.25) \leq S1/S2 \leq ((1-k)+0.25)$ is satisfied where S1 represents the horizontal cross sectional area of raw material block 11, S2 represents the horizontal cross sectional area of GaAs crystal 12 produced, and k represents the segregation coefficient of impurity contained in Si—GaAs melt 9. It is noted that, since the respective steps of the production method in the second embodiment are the same as those in the first embodiment, description of the respective steps will not be repeated. How to derive the above-described equation will be described below. In the present embodiment, when $((1-k)-0.125) \leq S1/S2 \leq ((1-k)+0.125)$ holds, a semiconductor crystal more excellent in uniformity can be produced.

In the present embodiment, heat-resistant container 3 is moved downward relatively with respect to the temperature gradient. Raw material block 11 and Si—GaAs melt 9 will thus be moved downward at the same speed with respect to the temperature gradient. Therefore, melting speed v1 of raw material block 11 and growing speed v2 of GaAs crystal 12 can be expressed as shown in the following equations (1) and (2), respectively:

$$v1 = v0 \times S1 \text{ (where } v0 \text{ represents the moving speed of heat-resistant container 3, and } S1 \text{ represents the horizontal cross sectional area of raw material block 11)} \quad (1)$$

$$v2 = v0 \times S2 \text{ (where } S2 \text{ represents the cross sectional area of GaAs crystal 12)} \quad (2)$$

A minute time dt is now considered. Assuming the Si amount in the GaAs melt at a certain time point as C0, the Si amount that will be contained in the GaAs melt solidified in the minute time dt from that time point can be expressed as C0×v2×dt. Actually, however, not the whole Si in the GaAs melt solidified in minute time dt will be contained in the GaAs crystal, but a Si amount qm expressed by the following equation (3) will remain in the GaAs melt due to segregation, without being incorporated into the GaAs crystal. Here, k represents a segregation coefficient of Si.

$$qm = (1-k) \times C0 \times v2 \times dt \quad (3)$$

On the other hand, an amount w of GaAs melt dropped in minute time dt can be expressed as v1×dt. If the Si amount in the dropped GaAs melt is sufficiently less than qm, the Si concentration in the GaAs melt can be kept constant (=C0) if the following equation (4) is satisfied:

$$qm/w = C0 \quad (4)$$

Then, it can be seen from the equations (1) to (4) that, ideally, the Si concentration in the GaAs melt can be kept constant if the following equation (5) is satisfied:

$$(1-k) = S1/S2 \quad (5)$$

Actually, however, melting speed v1 of the suspended raw material and growing speed v2 of the GaAs crystal may be varied depending on the furnace structure, the input power from heaters, the size and length of the suspended raw material and the crystal grown. Therefore, as a result of intense studies paying attention to the ratio of S1 to S2 (S1/S2), the present inventor has found that a crystal having uniform Si concentration (impurity concentration) and carrier concentration (electron concentration) can be obtained at a solidified fraction of 0.1 to 0.8 within the range of the following equation (6). It has also been found that, within the range of the following equation (7), a crystal having more uniform Si concentration and carrier concentration can be obtained at a solidified fraction of 0.1 to 0.8. It has further been found that, at a solidified fraction in a wide range of 0.1 to 0.85, a crystal having uniform Si concentration and carrier concentration can be obtained.

$$((1-k)-0.25) \leq S1/S2 \leq ((1-k)+0.25) \quad (6)$$

$$((1-k)-0.125) \leq S1/S2 \leq ((1-k)+0.125) \quad (7)$$

From the foregoing, when the above-described equation (6) and further the above-described equation (7) are satisfied, changes in impurity concentration in Si—GaAs melt 9 due to dropping of GaAs melt 13 can be compensated for accurately.

In the present embodiment, the segregation coefficient of Si as an impurity is 0.14, and when this is substituted into the above-described equation (6), the following equation (8) will be obtained.

$$0.61 \leq S1/S2 \leq 1.11 \quad (8)$$

In the present embodiment, by using a raw material block whose horizontal cross sectional area S1 is formed to satisfy the above-described equation (8) as raw material block 11, changes in impurity concentration in Si—GaAs melt 9 resulting from the segregation coefficient of Si can be compensated for accurately. It is noted that, in crystal production apparatus 100, cross sectional area S2 of GaAs crystal 12 produced is identical to horizontal cross sectional area S0 of the inner space of longitudinal container 1, so that S1/S2 can easily be calculated.

Moreover, according to the present embodiment, since raw material block 11 is suspended on the simple structure as described above, a section of raw material block 11 to be melted is hardly restricted in shape, and therefore can easily be changed such that the cross sectional area of raw material block 11 satisfies the above-described equation (6), and more preferably, the above-described equation (7).

Third Embodiment

Semiconductor Crystal Production Apparatus

Structure of Crystal Production Apparatus

Figure 4:
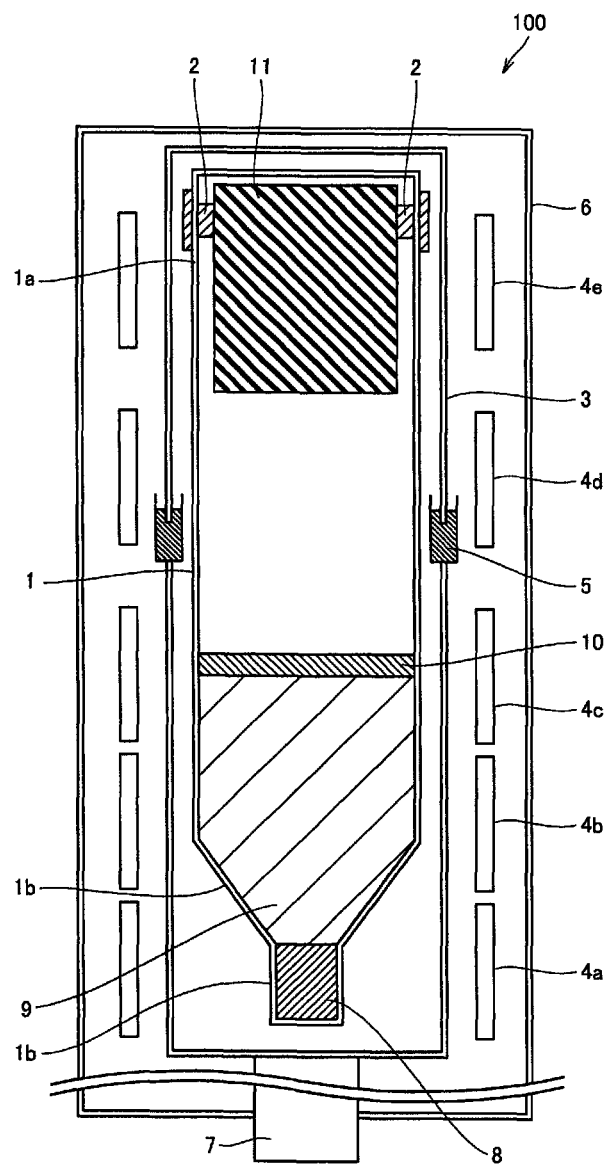
FIG. 4 is a schematic cross sectional view of a preferable example of a production apparatus according to the present invention.

FIG. 4 is a schematic cross sectional view of a preferable example of the production apparatus according to the present embodiment.

Crystal production apparatus 100 according to the present embodiment includes vertical longitudinal container 1 for placing seed crystal 8 in bottom section 1b and placing Si—GaAs melt 9 on seed crystal 8, suspension part 2 arranged in upper section 1a in this longitudinal container 1 and located above bottom section 1b in the longitudinal direction and for suspending raw material block 11 having a Si concentration lower than that of Si—GaAs melt 9 toward Si—GaAs melt 9, and heaters 4a to 4e for heating longitudinal container 1.

Crystal production apparatus 100 can further include heat-resistant container 3 that encloses longitudinal container 1 and suspension part 2, $B_2O_3$ seal 5 for sealing heat-resistant container 3, a chamber 6 that stores heat-resistant container 3 and heaters 4a to 4e, and lower shaft 7 for moving heat-resistant container 3 in the vertical direction. In longitudinal container 1, sealant 10 made of $B_2O_3$ may be placed on Si—GaAs melt 9.

Suspension part 2 should only suspend raw material block 11 at a position substantially perpendicularly above Si—GaAs melt 9 in longitudinal container 1 where raw material block 11 is not in contact with Si—GaAs melt 9, and the position of upper section 1a shown in FIG. 4 is not a limitation. Suspension part 2 is preferably composed of at least one of the group consisting of BN (boron nitride), pBN (pyrolytic BN), $Al_2O_3$ (alumina), AlN (aluminium nitride), SiC (silicon carbide), quartz, Mo (molybdenum), W (tungsten), Ta (tantalum), and stainless steel. They have high heat resistance and high strength even at high temperatures, and can therefore prevent chipping of suspension part 2, contamination due to falling of chips, and the like.

Heat-resistant container 3 is preferably made of airtight carbon, BN, pBN, $Al_2O_3$, AlN, SiC, quartz, Mo, W, Ta, stainless steel, or composite materials thereof from the viewpoint of heat resistance.

Heaters 4a to 4e are each arranged so as to surround heat-resistant container 3. Heaters 4a to 4e can set a temperature gradient in the vertical direction of heat-resistant container 3 (vertical direction of longitudinal container 1). It is noted that the number of heaters and the arrangement of each heater are not limited as such, and they should only be configured such that the temperature gradient can be created in the vertical direction of heat-resistant container 3.

$B_2O_3$ seal 5 is arranged at a gap of heat-resistant containers 3. $B_2O_3$ heated by the heaters, for example, by heater 4d is melted, thereby sealing heat-resistant container 3. When GaAs crystal 12 is grown up with heat-resistant container 3 sealed, growing GaAs crystal 12 is less likely to be affected from the outside, and can thus grow up stably. Such a sealed-type heat-resistant container that no gap is left may be used instead of providing $B_2O_3$ seal 5. For example, a quartz-made heat-resistant container sealed into vacuum using a burner or the like can be used.

Lower shaft 7 supporting heat-resistant container 3 can be moved in the vertical direction with respect to chamber 6. Therefore, heat-resistant container 3 is moved in the vertical direction with respect to chamber 6 along with the movement of lower shaft 7. Accordingly, each section in heat-resistant container 3 can be moved in the vertical direction relatively with respect to the heaters that create a predetermined temperature gradient within chamber 6. It is noted that the mode in which heat-resistant container 3 is moved in the vertical direction relatively with respect to heaters 4a to 4e is not limited as such. For example, heaters 4a to 4e may be moved in the vertical direction, instead of moving lower shaft 7 and heat-resistant container 3. Alternatively, the temperature gradient provided in the longitudinal direction of longitudinal container 1 may be shifted by controlling the temperature of heaters 4a to 4c without moving longitudinal container 1.

<<Operation of Crystal Production Apparatus>>

In crystal production apparatus 100, heaters 4a to 4e generate heat such that the temperature gradient shown in the graph of FIG. 1, for example, is created in the vertical direction in heat-resistant container 3. The temperature of each member stored in heat-resistant container 3 depends on the temperature gradient created by heat generated by the heaters. Therefore, as a result, the temperature gradient shown in the graph of FIG. 1 is created in the vertical direction of longitudinal container 1 with seed crystal 8, Si—GaAs melt 9 and raw material block 11 disposed therein. Thereafter, support unit 7 is moved downward, so that heat-resistant container 3 is moved downward relatively with respect to the temperature gradient. By moving heat-resistant container 3 downward relatively with respect to the temperature gradient, Si—GaAs melt 9 is solidified from its lower side that is in contact with seed crystal 8. On the other hand, raw material block 11 is melted at its lower end, and the melt is dropped into Si—GaAs melt 9.

With the above structure, changes in impurity concentration in Si—GaAs melt 9 can be compensated for by the dropped GaAs melt, as a result of which the carrier concentration and the impurity concentration in the growing GaAs crystal can be uniformalized.

In the present embodiment, since raw material block 11 is suspended directly in longitudinal container 1, no displacement of raw material block 11 in the vertical direction will take place even if the lower part of raw material block 11 is melted. Thus, in crystal production apparatus 100, there is no complicated changes in dropping speed of GaAs melt 13 that would result from a displacement of the dropping raw material. Therefore, the various parameters for compensating for changes in carrier concentration and impurity concentration in Si—GaAs melt 9 can easily be set, as a result of which a semiconductor crystal excellent in uniformity of carrier concentration and impurity concentration can be produced with high reproducibility.

Fourth Embodiment

Semiconductor Crystal

In the present invention, a produced semiconductor crystal excellent in uniformity of carrier concentration and impurity concentration has a rate of change in carrier concentration less than or equal to 0.5 at a solidified fraction of 0.1 to 0.8. At a solidified fraction of 0.1 to 0.85, the rate of change in carrier concentration is less than or equal to 0.5. The rate of change in carrier concentration is a value calculated by the following equation (9). In the following equation (9), C(Max) represents the carrier concentration in a portion in the semiconductor crystal whose carrier concentration is the highest, and C(Min) represents the carrier concentration in a portion in the semiconductor crystal whose carrier concentration is the lowest. It is noted that the rate of change in carrier concentration serves as an index indicating the uniformity of impurity concentration in the semiconductor crystal.

$$(C(Max)-C(Min))/C(Min) \qquad (9)$$

In the present invention, a produced semiconductor crystal excellent in uniformity of carrier concentration and impurity concentration may have a rate of change in impurity concentration less than or equal to 0.5 at a solidified fraction of 0.1 to 0.8. Further, the rate of change in impurity concentration may be less than or equal to 0.5 at a solidified fraction of 0.1 to 0.85. The rate of change in impurity concentration is a value calculated by the following equation (10). In the following equation (10), I(Max) represents the impurity concentration in a portion in the semiconductor crystal whose impurity concentration is the highest, and I(Min) represents the impurity concentration in a portion in the semiconductor crystal whose impurity concentration is the lowest. It is noted that the rate of change in impurity concentration serves as an index indicating the uniformity of impurity concentration in the semiconductor crystal.

$$(I(Max)-I(Min))/I(Min) \qquad (10)$$

The semiconductor of the semiconductor crystal should only be a compound semiconductor such as GaAs, InP, InAs, or GaP. As an impurity, at least one of the group consisting of In, Zn, Si, Al, S, Sn, Se, Te, Cr, C, O, Fe, and Ga may be contained.

Alternatively, the semiconductor of the semiconductor crystal may be a semiconductor such as Ge, Si or GeSi. As an impurity, at least one of the group consisting of As, Ga, In, P, B, and Sb may be contained.

A semiconductor crystal having a rate of change in carrier concentration or impurity concentration less than or equal to 0.5 at a solidified fraction of 0.1 to 0.8 can be produced with high reproducibility by the production method according to the present invention. At a solidified fraction of 0.1 to 0.85, a semiconductor crystal having a rate of change in carrier concentration or impurity concentration less than or equal to 0.5 can only be produced by the production method according to the present invention.

EXAMPLES

Example 1

A GaAs crystal containing Si as an impurity was produced using crystal production apparatus 100 shown in FIG. 4 under the conditions shown in Table 1. The production method will be described below.

TABLE 1

| | Inner diameter of longitudinal container | Raw material placed in bottom section of longitudinal container | | Dropping raw material | | S1/S2 |
|---|---|---|---|---|---|---|
| | | GaAs (g) | Si(mg) | GaAs (g) | Si (mg) | |
| Example 1 | 7.6 cm (3 inches) | 3050 | 305 | 5500 | 0 | 0.90 |
| Example 2 | 7.6 cm (3 inches) | 3100 | 310 | 5550 | 5 | 0.90 |
| Example 3 | 7.6 cm (3 inches) | 2950 | 295 | 5350 | 0 | 0.90 |
| Example 4 | 10 cm (4 inches) | 6100 | 610 | 8550 | 0 | 0.94 |
| Example 5 | 10 cm (4 inches) | 6150 | 615 | 8450 | 0 | 0.94 |
| Example 6 | 7.6 cm (3 inches) | 3100 | 310 | 5550 | 0 | 0.55 |
| Example 7 | 7.6 cm (3 inches) | 3150 | 320 | 5550 | 0 | 1.17 |
| Example 8 | 7.6 cm (3 inches) | 3080 | 309 | 7150 | 0 | 0.90 |
| Example 9 | 7.6 cm (3 inches) | 3110 | 312 | 7210 | 0 | 0.62 |
| Example 10 | 7.6 cm (3 inches) | 3000 | 301 | 6960 | 0 | 1.10 |
| Example 11 | 10 cm (4 inches) | 6120 | 613 | 11100 | 0 | 0.74 |
| Example 12 | 10 cm (4 inches) | 6160 | 617 | 10990 | 0 | 0.98 |
| Comparative Example 1 | 7.6 cm (3 inches) | 1000 | 62 | 5500 | 0 | — |
| Comparative Example 2 | 7.6 cm (3 inches) | 3100 | 310 | 5550 | 0 | — |
| Comparative Example 3 | 7.6 cm (3 inches) | 3050 | 305 | 5600 | 5 | — |
| Comparative Example 4 | 10 cm (4 inches) | 1500 | 93 | 6500 | 2 | — |
| Comparative Example 5 | 10 cm (4 inches) | 5800 | 580 | 8400 | 0 | — |
| Comparative Example 6 | 10 cm (4 inches) | 6100 | 610 | 8650 | 8 | — |

First, longitudinal container 1 with a seed crystal and an impurity-containing melt placed in bottom section 1b and with suspension part 2 suspending a raw material block arranged in upper section 1a was prepared.

Specifically, first, as the step of placing the raw material on the seed crystal, seed crystal 8 was placed in bottom section 1b of longitudinal container 1 having an inner diameter of 7.6 cm (3 inches), and GaAs polycrystal of 3050 g and a predetermined amount of Si crystal piece, as a raw material, were placed on seed crystal 8. Further, sealant 10 made of $B_2O_3$ was placed on the GaAs polycrystal.

Then, as the step of suspending the dropping raw material block, GaAs polycrystal of 5500 g as raw material block 11 was suspended on suspension part 2 arranged in upper section 1a of longitudinal container 1. Raw material block 11 did not contain Si. Horizontal cross sectional area Si of the GaAs crystal produced was the sectional area in longitudinal container 1 of 3.8×3.8×3.14, and the segregation coefficient of Si was 0.14. Thus, raw material block 11 formed to have a sectional area of 41 cm$^2$ so as to satisfy the above-described equation (6) was used. S1/S2 at this time was 0.90.

Then, as the step of disposing the impurity-containing melt on the seed crystal, the temperature of each of heaters 4a to 4e is raised to melt $B_2O_3$ seal 5 to seal heat-resistant container 3, following which the GaAs polycrystal and the Si crystal piece were melted to prepare Si—GaAs melt 9. Si—GaAs melt 9 was thereby disposed on seed crystal 8. The weight of Si in Si—GaAs melt 9 at this time was 305 mg.

Then, the temperature gradient was provided in the longitudinal direction for longitudinal container 1 prepared by the above steps, and longitudinal container 1 was moved relatively with respect to the temperature gradient.

Specifically, the temperature gradient shown in FIG. 1 was set in the vertical direction of heat-resistant container 3 by temperature control of each of heaters 4a to 4e. Then, heat-resistant container 3 was gradually moved downward by moving support shaft 7 downward at a speed of 5 mm/h with respect to the temperature gradient.

With this movement, the melt in longitudinal container 1 was moved downward at a moving speed of 5 mm/h in a region with the temperature gradient set by each heater to drop at a rate of 20° C./cm while advancing downward. Along with the movement of heat-resistant container 3, raw material block 11 was moved downward at a moving speed of 5 mm/h in a region with the temperature gradient set to rise at a rate of 20° C./cm while advancing downward.

Then, GaAs crystal 12 thus produced was extracted from longitudinal container 1 to examine the carrier concentration in its growth direction (of a crystalline portion at a solidified fraction of 0.1 to 0.9) with a Hall measurement technique. Of the carrier concentration at each solidified fraction of 0.1 to 0.8, denoting the lowest concentration by C(Min) and the highest concentration by C(Max), the rate of change in carrier concentration was calculated using the above-described equation (9). The dropping speed of GaAs melt 13 with respect to the moving distance of longitudinal container 1 was also measured. It is noted that the moving distance of longitudinal container 1 is the moving distance in which longitudinal container 1 had been moved assuming the position of longitudinal container 1 when located at the position shown in FIG. 1(a) as a reference position of longitudinal container 1.

Examples 2 to 12

In Examples 2 to 5, the internal diameter of longitudinal container 1, the weight of GaAs melt, the weight of Si in GaAs melt, the weight of raw material block 11, and the weight of Si in raw material block 11 were changed as shown in Table 1, In Examples 2 and 3, raw material block 11 formed to have a cross sectional area of 41 cm² (S1/S2=0.90) was used, and in Examples 4 and 5, raw material block 11 formed to have a cross sectional area of 74 cm² (S1/S2=0.94) was used. Then, a GaAs crystal was produced similarly to Example 1.

In Example 6, raw material block 11 formed to have a cross sectional area of 25 cm² (S1/S2=0.55) was used, and in Example 7, raw material block 11 formed to have a cross sectional area of 53 cm² (S1/S2=1.17) was used. Then, a GaAs crystal was produced similarly to Example 1.

In Examples 8 to 12, raw material block 11 having a weight increased by about 30% with respect to Examples 1 to 5, respectively, was used. The cross sectional areas of raw material blocks 11 in Examples 8 to 12 were 41 cm², 28 cm², 50 cm², 58 cm², and 77 cm², respectively.

Then, the carrier concentration of the GaAs crystal produced in Examples 2 to 12 at a solidified fraction of 0.1 to 0.9 was measured to calculate the rate of change in carrier concentration at a solidified fraction of 0.1 to 0.8. In Example 4, the dropping speed of GaAs melt 13 with respect to the moving distance of longitudinal container 1 was measured.

Comparative Examples 1 to 6

Figure 7:
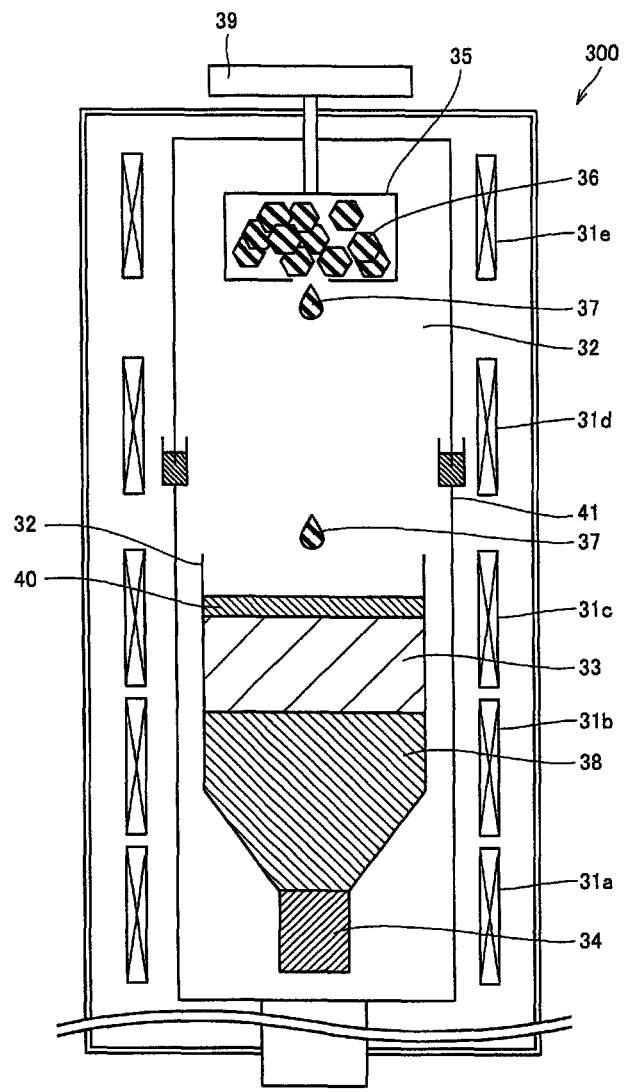
FIG. 7 is a schematic cross sectional view of another example of the conventional production apparatus for a semiconductor crystal.

A GaAs crystal containing Si as an impurity was produced using crystal production apparatus 300 shown in FIG. 7 under the respective conditions shown in Table 1.

First, a seed crystal 34, a GaAs polycrystal and a Si crystal piece were placed in a crucible 32, and a sealant 40 was further placed on the GaAs polycrystal and the Si crystal piece.

Then, a plurality of blocks of GaAs polycrystal as a dropping raw material were placed in a container 35 arranged above crucible 32 at a ceiling section of the heat-resistant container.

Then, a $B_2O_3$ seal was melted by heating with heaters to seal the inside of the heat-resistant container, following which the GaAs polycrystal and the Si crystal piece were melted to prepare a Si—GaAs melt.

Then, a temperature gradient similar to that of Example 1 was set in the vertical direction of the heat-resistant container by controlling the temperature of each heater. Then, heat-resistant container 3 was moved downward at a moving speed of 5 mm/h to produce a Si-containing GaAs crystal. During the movement of the heat-resistant container, weighing machine 39 measured the weight of blocks of GaAs polycrystal in container 35, and if the ratio of the decreasing speed of the mass to the growing speed of GaAs crystal was deviated from a predetermined ratio, the temperature gradient or the moving speed was finely adjusted.

Then, the carrier concentration of the produced GaAs crystal at a solidified fraction of 0.1 to 0.9 was measured to calculate the rate of change in carrier concentration at a solidified fraction of 0.1 of 0.8. In Comparative Example 2 and Comparative Example 4, the dropping speed of the GaAs melt with respect to the moving distance of crucible 32 was measured.

The carrier concentration at each solidified fraction and the rate of change in calculated carrier concentration for Examples 1 to 12 and Comparative Examples 1 to 6 are summarized in Table 2.

TABLE 2

| | Carrier concentration in GaAs crystal ($\times 10^{18}$ cm$^{-3}$) Solidified fraction | | | | | | | | | | Rate of change in carrier concentration |
|---|---|---|---|---|---|---|---|---|---|---|---|
| | 0.1 | 0.2 | 0.3 | 0.4 | 0.5 | 0.6 | 0.7 | 0.8 | 0.85 | 0.9 | |
| Example 1 | 1.08 | 1.01 | 0.99 | 1.01 | 1.02 | 1.07 | 1.15 | 1.35 | — | 3.27 | 0.364 |
| Example 2 | 1.07 | 1.03 | 1.01 | 1.02 | 1.05 | 1.08 | 1.19 | 1.39 | — | 3.55 | 0.376 |
| Example 3 | 1.10 | 1.05 | 1.02 | 1.03 | 1.05 | 1.10 | 1.21 | 1.40 | — | 3.75 | 0.373 |
| Example 4 | 1.04 | 1.03 | 1.01 | 1.00 | 1.02 | 1.04 | 1.20 | 1.35 | — | 3.40 | 0.350 |
| Example 5 | 1.09 | 1.07 | 1.04 | 1.02 | 1.04 | 1.07 | 1.25 | 1.38 | — | 3.60 | 0.353 |
| Example 6 | 1.03 | 1.05 | 1.07 | 1.10 | 1.15 | 1.21 | 1.36 | 1.55 | — | 3.43 | 0.505 |
| Example 7 | 1.04 | 1.01 | 0.92 | 0.86 | 0.82 | 0.80 | 0.72 | 0.63 | — | 3.35 | 0.651 |
| Example 8 | 1.06 | 1.04 | 1.03 | 1.02 | 1.04 | 1.06 | 1.09 | 1.15 | 1.29 | 1.89 | 0.127 |
| Example 9 | 1.04 | 1.03 | 1.01 | 1.00 | 1.04 | 1.06 | 1.08 | 1.11 | 1.23 | 1.85 | 0.110 |
| Example 10 | 1.02 | 1.03 | 1.05 | 1.06 | 1.07 | 1.09 | 1.11 | 1.14 | 1.27 | 1.92 | 0.118 |
| Example 11 | 1.07 | 1.06 | 1.04 | 1.03 | 1.05 | 1.07 | 1.08 | 1.16 | 1.30 | 1.96 | 0.126 |
| Example 12 | 1.05 | 1.04 | 1.02 | 1.01 | 1.03 | 1.07 | 1.09 | 1.12 | 124 | 1.87 | 0.109 |
| Comparative Example 1 | 0.98 | 0.97 | 0.95 | 1.00 | 1.05 | 1.00 | 0.97 | 0.95 | — | 1.30 | 0.105 |
| Comparative Example 2 | 1.05 | 0.97 | 0.91 | 0.85 | 0.89 | 0.95 | 1.13 | 1.25 | — | 4.20 | 0.471 |
| Comparative Example 3 | 0.98 | 0.88 | 0.92 | 0.95 | 1.01 | 1.10 | 1.32 | 1.46 | — | 3.20 | 0.659 |
| Comparative Example 4 | 1.08 | 1.16 | 0.99 | 0.93 | 0.96 | 1.23 | 1.23 | 1.42 | — | 3.80 | 0.527 |
| Comparative Example 5 | 1.05 | 1.18 | 1.07 | 1.04 | 1.09 | 1.28 | 1.42 | 1.38 | — | 4.60 | 0.327 |
| Comparative Example 6 | 1.06 | 1.15 | 1.19 | 1.23 | 1.25 | 1.29 | 1.50 | 1.80 | — | 2.50 | 0.565 |

According to Table 2, it has been revealed that, in any case of Examples 1 to 5, the rate of change in carrier concentration was less than or equal to 0.40, so that the uniformity of carrier concentration in the GaAs crystal was excellent. On the other hand, in Comparative Example 1, the rate of change in carrier concentration was as low as 0.105, and the uniformity of carrier concentration was excellent, however, the rate of change in carrier concentration in Comparative Examples 2 to 6 varied within the range of 0.3 to 0.7. That is, it has been revealed that it was difficult in the conventional crystal production apparatus to produce a GaAs crystal having a uniform carrier concentration with high reproducibility.

According to Example 6 and Example 7, the rate of change in carrier concentration was as large as more than or equal to 0.5, as compared with Examples 1 to 5. This is presumed because the cross sectional area of raw material block 11 in Examples 6 and 7 did not satisfy the above-described equation (6), and the temperature gradient set in crystal production apparatus 100 and the moving speed of heat-resistant container 3 were not suitable in Examples 6 and 7. Therefore, when the shape of raw material block 11 does not satisfy the above-described equation (6), it is preferable to change the moving speed of each of raw material block 11 and Si—GaAs melt 9 in longitudinal container 1.

According to Examples 8 to 12, it has been revealed that the rate of change in carrier concentration at a solidified fraction of 0.1 to 0.8 decreased as the weight of suspended raw material block 11 increased, that is, as the ratio of raw material block 11 to Si—GaAs melt 9 placed in longitudinal container 1 increased. It has also been revealed that, in a wider range of crystal at a solidified fraction of 0.1 to 0.85, uniformity of carrier concentration similar to that of Examples 1 to 5 in which the raw material block had a small weight could be obtained. This is presumed because condensation of Si in the GaAs melt could be suppressed more appropriately up to the last portion of crystal (portion at a large solidified fraction) as the amount of the dropping raw material increased.

Figure 5:
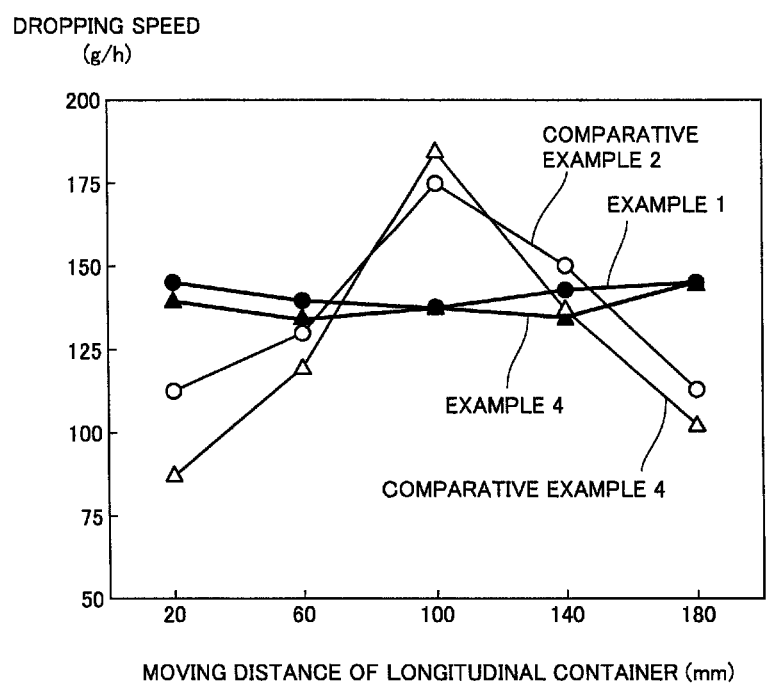
FIG. 5 is a graph showing the relationship between the dropping speed of a melt of the raw material block and the moving distance of a longitudinal container.
Figure 6:
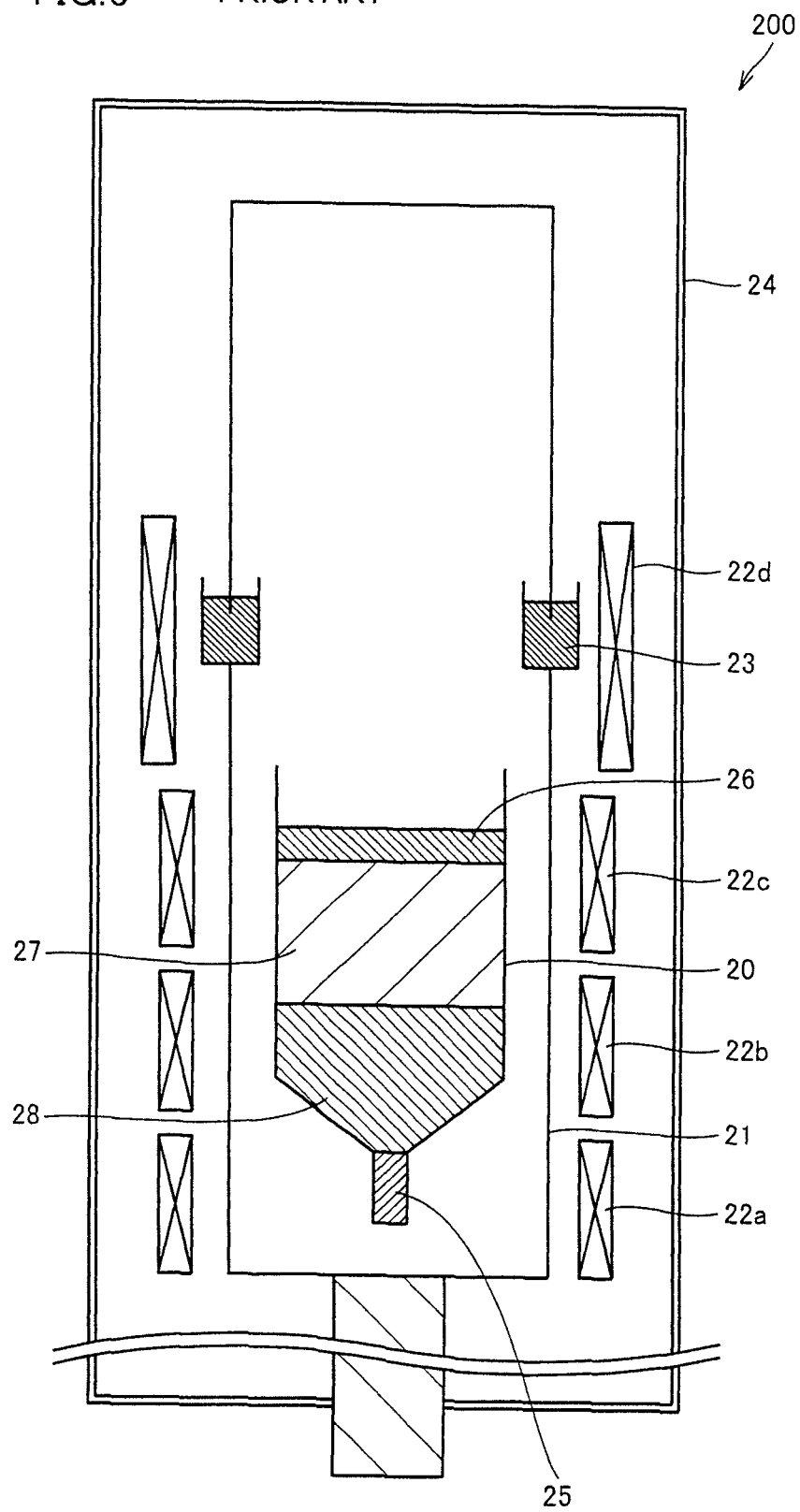
FIG. 6 is a schematic cross sectional view of an example of a conventional production apparatus for a semiconductor crystal.

In addition, the relationship between the dropping speed of the melt of the raw material block and the moving distance of the longitudinal container is shown in the graph of FIG. 5 for Examples 1 and 4 as well as Comparative Examples 2 and 4. In FIG. 5, a solid circle indicates Example 1, a solid triangle indicates Example 4, a hollow circle indicates Comparative Example 2, and a hollow triangle indicates Comparative Example 4.

According to FIG. 5, it has been revealed that the dropping speed was almost constant in Examples 1 and 4, while the dropping speed in Comparative Examples 2 and 4 varied. Therefore, in order to make the ratio between the dropping speed and the crystal growing speed (a decreasing amount of the melt in the crucible) constant, it has been revealed that, in crystal production apparatus 300, it is necessary to measure changes in weight of GaAs polycrystal 36 in container 35 to control the temperature complicatedly. On the other hand, it has been revealed that crystal production apparatus 100 according to the present invention offers easy temperature control since the dropping speed is almost constant.

It should be understood that the embodiments and examples disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

According to the present invention, a production method that can produce a semiconductor crystal having a uniform impurity concentration in the growth direction of a semiconductor crystal with high reproducibility can be provided. Therefore, the present invention is applied suitably to production of a substrate for a light emitting diode (LED) or a laser diode (LD), for example.

REFERENCE SIGNS LIST 1, 20, 32 longitudinal container; 2, 2c suspension part; 2a rod-like member; 2b ring-like member; 3, 21 heat-resistant container; 4a, 4b, 4c, 4e, 22a, 22b, 22c, 22d, 31a to 31e heater; 5, 23 $B_2O_3$ seal; 6, 24 chamber; 8, 25, 34 seed crystal; 9, 27, 33 Si—GaAs melt; 10, 26, 40 sealant; 11, 11c raw material block; 12, 28, 38 GaAs crystal; 13, 37 GaAs melt, 35 container; 36 raw material; 39 weighing machine; 100, 200, 300 crystal production apparatus.

The invention claimed is:

1. A method of producing a semiconductor crystal by placing a seed crystal and a melt containing an impurity in a longitudinal container and solidifying said impurity-containing melt from a lower side that is in contact with said seed crystal to an upper side, wherein said semiconductor crystal is produced by solidifying said impurity-containing melt from the lower side that is in contact with said seed crystal to the upper side while dropping, into said seed crystal and said impurity-containing melt placed in a bottom section of said longitudinal container, a melt of a dropping raw material block suspended above said bottom section and made of a semiconductor material having an impurity concentration lower than an impurity concentration of said impurity-containing melt, and $((1-k)-0.25) \leq S1/S2 \leq ((1-k)+0.25)$ is satisfied where S1 represents a horizontal cross sectional area of said dropping raw material block, S2 represents a horizontal cross sectional area of said semiconductor crystal, and k represents a segregation coefficient of the impurity contained in said impurity-containing melt.

2. The method of producing a semiconductor crystal according to claim 1, wherein said longitudinal container has said bottom section for placing therein said seed crystal and said impurity-containing melt, and an upper section located above said bottom section in a longitudinal direction, said production method comprising the steps of:

preparing said longitudinal container with said seed crystal and said impurity-containing melt placed in said bottom section and with a suspension part suspending said dropping raw material block arranged in said upper section; and moving said longitudinal container relatively with respect to a temperature gradient provided in the longitudinal direction of said longitudinal container, and in said relatively moving step, said impurity-containing melt is solidified from a side that is in contact with said seed crystal while said melt of said dropping raw material block is dropped.

3. The method of producing a semiconductor crystal according to claim 2, wherein said preparing step includes the steps of placing a raw material made of a semiconductor material and the impurity on said seed crystal placed in said bottom section, suspending said dropping raw material block on said suspension part arranged in said upper section, and melting the raw material made of said semiconductor material and said impurity to dispose said impurity-containing melt on said seed crystal.

4. The method of producing a semiconductor crystal according to claim 1, wherein said seed crystal, said impurity-containing melt and said dropping raw material block are made of at least one semiconductor material of the group consisting of GaAs, InP, InAs, and GaP, and said impurity is at least one of the group consisting of In, Zn, Si, Al, S, Sn, Se, Te, Cr, C, O, Fe, and Ga.

5. The method of producing a semiconductor crystal according to claim 1, wherein said seed crystal, said impurity-containing melt and said dropping raw material block are made of at least one semiconductor material of the group consisting of Ge, Si and GeSi, and said impurity is at least one of the group consisting of As, Ga, In, P, B, and Sb.

6. The method of producing a semiconductor crystal according to claim 1, wherein said suspension part is made of at least one of the group consisting of BN, pBN, $Al_2O_3$, AlN, SiC, quartz, Mo, W, Ta, and stainless steel.

* * * * *